United States Patent [19]
Chang et al.

[11] Patent Number: 4,803,533
[45] Date of Patent: Feb. 7, 1989

[54] IGT AND MOSFET DEVICES HAVING REDUCED CHANNEL WIDTH

[75] Inventors: Mike F. Chang, Cary; Hamza Yilmaz, Raleigh; George L. Gauffreau, Cary; King Owyang, Carboro, all of N.C.

[73] Assignee: General Electric Company, Fairfield, Conn.

[21] Appl. No.: 913,785

[22] Filed: Sep. 30, 1986

[51] Int. Cl.[4] ............................................. H01L 29/78
[52] U.S. Cl. ..................................... 357/23.4; 357/20; 357/63; 357/86
[58] Field of Search ...................... 357/23.4, 20, 86, 63

[56] References Cited

U.S. PATENT DOCUMENTS 4,593,302  6/1986  Lidow et al. .

FOREIGN PATENT DOCUMENTS 50773   5/1982  Fed. Rep. of Germany ..... 357/23.4
58-6170 1/1983  Japan ................................. 357/23.4

Primary Examiner—Joseph E. Clawson, Jr.
Attorney, Agent, or Firm—K. R. Glick

[57] ABSTRACT

During fabrication of an insulated gate device, a drain-forming dopant having a relatively low diffusion coefficient is implanted along a substrate surface which overlaps the boundary between a to-be-formed vertical drain region and a to-be-formed adjacent channel region. During subsequent high temperature processing the low diffusion coefficient drain-forming dopant remains concentrated near the top surface of the substrate while other well-forming dopants, including an adjacent channel-forming dopant, which have relatively higher diffusion coefficients, diffuse to deeper regions of the substrate. The slow-diffusing drain-forming dopant retards lateral widening of the channel by the faster-diffusing channel-forming dopant just below the substrate surface to at least the depth of the channel inversion layer formed under the channel surface during device turn on. Retardation of lateral channel growth just below the substrate surface results in an insulated gate device of reduced channel length and improved transconductance.

In a preferred embodiment, the slow-diffusing drain-forming dopant is implanted on the substrate surface together with a fast-diffusing drain-forming dopant, and the latter is diffused to a pinch off depth below the substrate surface to counteract pinch off resistance between opposed segments of an adjacent shallow channel-forming well.

6 Claims, 11 Drawing Sheets

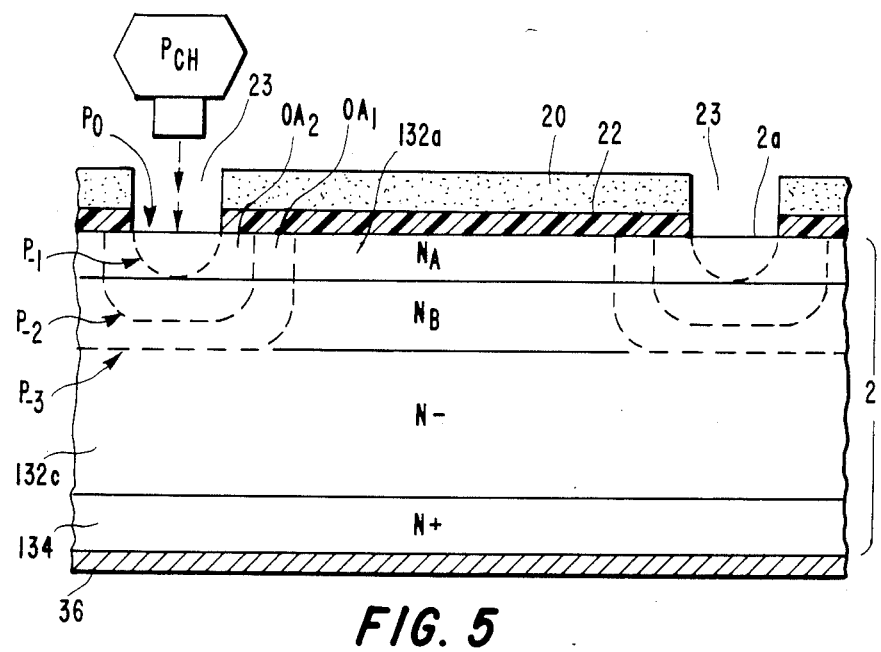
FIG. 5
FIG. 6
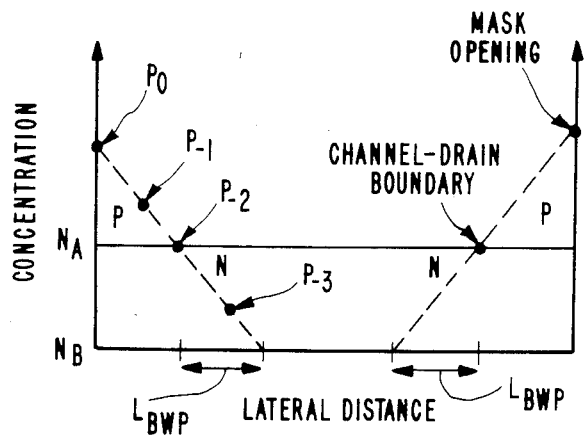

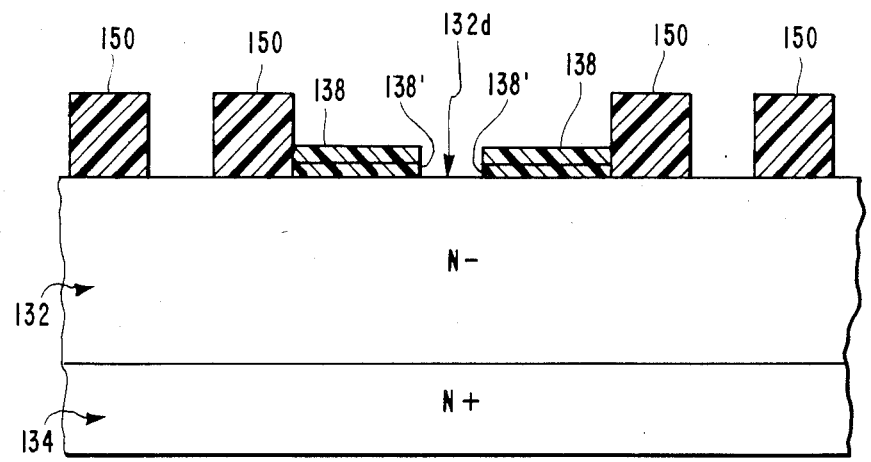
FIG. 10
FIG. 11
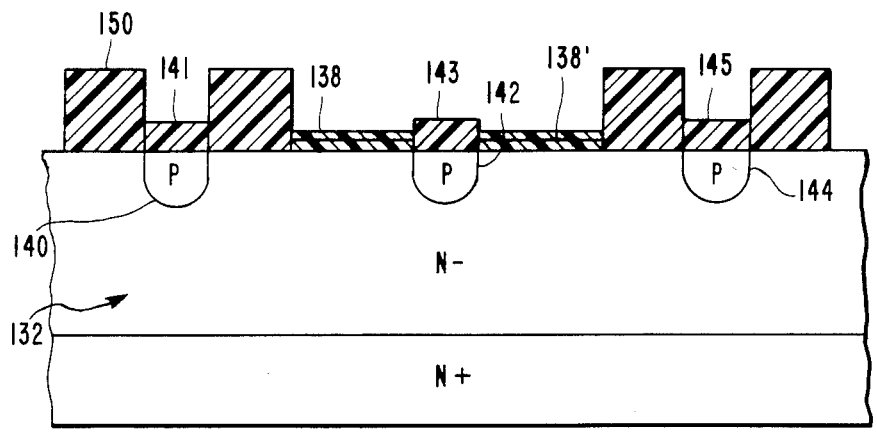

IGT AND MOSFET DEVICES HAVING REDUCED CHANNEL WIDTH

BACKGROUND OF THE INVENTION

1. Field of the Invention

The present invention relates to insulated gate devices such as insulated gate transistors (IGT's) and metal-oxide-semiconductor field-effect-transistors (MOSFET's) which have lateral surface channels and more specifically to a method for reducing the width of such channels.

2. Description of the Related Art

FIG. 1(a) is a cross sectional view of a typical power MOSFET 1 which is fabricated on a semiconductor substrate 2 and connected in series to an external load $R_{LOAD}$ and a power supply $+HV$. When the MOSFET 1 is switched to the ON state, a conductive series path forms internally between a source terminal S and a drain terminal D. It is desirable to minimize the total resistance of this internal conductive path, hereinafter referred to as the total on resistance $R_{DSon}$, such that maximum power will be delivered to the external load $R_{LOAD}$. When the MOSFET 1 is switched to the OFF state, it is desirable to form a nonconductive reverse bias area between the D and S terminals that is able to withstand relatively large voltages without breaking down. Furthermore, activation of an inherent parasitic transistor formed by the source, channel and drain regions of the device (described below) is to be avoided for proper operation of the MOSFET 1.

A compromise has usually been struck between the above mentioned objectives when devices such as the MOSFET 1 of FIG. 1(a) are designed. Realization of both a high voltage block in the nonconducting OFF state and low internal resistance during the conducting ON state is often difficult because of a common pinching mechanism that affects both parameters in a counteracting manner. The pinching mechanism is believed to occur generally within a vertical portion 31 of a drain region 30 disposed under an insulated polysilicon gate 20 of the MOSFET 1. The pinching mechanism adversely affects the conductivity of the vertical drain portion 31, primarily between opposed knee segments, 14d and 14d', of a pair of wells 14 and 14' by depleting charge carriers from that area during the ON state. When the MOSFET is in the OFF state however, the same pinching mechanism enhances the MOSFET's ability to withstand relatively large voltages without breaking down.

In one prior device, a doping agent was implanted at the top surface 32d of a drain epitaxial region 32 to establish a relatively high doping concentration $N_I+$ in the vertical drain portion 31 of the MOSFET. A relatively low doping concentration $N-$ existed in remaining portions of the drain epitaxial region 32, below the vertical portion 31. The surface implant concentration $N_I+$ of the single doping agent was adjusted to set the on resistance $R_{DSon}$ and the maximum blocking voltage $V_{DSmax}$ of the MOSFET through counteracting aspects of the pinching mechanism.

Aspects of the pinching mechanism that contribute to the on resistance $R_{DSon}$ of the illustrated MOSFET 1 may be better understood by referring also to an enlarged view of a portion of the MOSFET 1 shown in FIG. 1(b) and to the equivalent circuit of FIG. 2(a). When a gate voltage $V_G$, applied to the polysilicon gate 20 exceeds a predetermined threshold voltage of the MOSFET, charge carrier inversion occurs within a relatively small inversion depth a (usually less than one micron) just below the top surface 2a of the substrate 2. This creates an n-channel 15 in a p-type double-diffused well 14 of the MOSFET 1.

A channel region 14a projects to the substrate surface 2a from the P-well 14. The well 14 includes a shallow region 14b, contiguous with and extending vertically downward from the channel region 14a, and a surface contact region 14c (FIG. 1(a)), overlying a deeper portion 14e of the double diffused P-well. A silicon dioxide insulating layer 22 separates the polysilicon gate 20 from the top surface 2a of the channel region 14a.

When the n-channel 15 (FIG. 1(b)) is induced by an appropriate gate voltage $V_G$, it acts as an n-type conductive layer that communicates laterally between a heavily doped n-type source region 12 (N+) and the top of the vertical drain portion 31 ($N_I+$) (FIG. 1(a)). The n-channel 15 completes a conductive series path between the S and D terminals, allowing an electron current $I_{DSe}$ to flow laterally from a source contact layer 10, through the source region 12 (N+), to a top layer 32a of the drain epitaxial region 32. The current $I_{DSe}$ continues downwardly through a middle layer 32b and bottom layer 32c of the drain epitaxial region 32 to exit the MOSFET through a heavily doped bulk region 34 (N+) and a metal drain contact layer 36.

As the electron current $I_{DSe}$ flows through the described path, it encounters several resistances including a channel resistance $R_{CH}$ (FIG. 2(a)), a pinch off resistance $R_{JFET}$, and an epitaxial resistance $R_{EPX}$. In general, the first two resistances are believed to result from narrow constrictions in lateral and vertical portions of the described conductive path. The induced n-channel 15 in the lateral portion of the conductive path, for example, is typically less than one micron deep and often forms to a depth of less than 0.1 micron. The channel resistance $R_{CH}$ is determined primarily by the inversion depth a of the induced n-channel 15 and the lateral width $L_{CH}$ of the channel region 14a.

The pinch off resistance $R_{JFET}$ results from a depletion zone constriction in the middle portion 32b of the drain epitaxial region 32 which occurs at a pinching depth b (see FIG. 1(b)) between closely spaced opposing knee segments, 14d and 14d' of the shallow regions 14b and 14b' of one or more double diffused P-wells 14, 14' that are formed around the vertical drain portion 31 (FIG. 1(a)) during fabrication. Shallow regions 14b and 14b' are separated from the adjacent vertical drain portion 31 by a PN junction which is generally reverse biased such that a charge carrier depletion zone 35 (dotted area) grows outwardly from the PN junction into the middle layer 32b of the vertical drain portion 31 as the voltage $V_{DS}$, applied between the D and S terminals, increases. As the depletion zone 35 expands into region 32, it reduces the conductive cross-sectional area of region 32, particularly in the vertical drain region between the opposed knee segments, 14d and 14d'. This constriction of the conductive cross-sectional area, commonly known as pinching creates the $R_{JFET}$ resistance to curent flow.

The third resistance, $R_{EXP}$ results from the light doping (N−) in the relatively wide bottom layer 32c of the epitaxial region 32. Light doping of the bottom layer 32c is believed to cause an enlargement in the width of the depletion zone 35 surrounding the PN junction between the P-wells 14, 14' and the bottom layer 32c.

This enlargement of the depletion zone minimizes lectric field intensity within the semiconductor material of the substrate 2 surrounding the PN junction and helps prevent avalanche breakdown when the MOSFET 1 is switched to the OFF state.

The total on resistance $R_{DSon}$ of the MOSFET is determined in major by the sum of $R_{CH}$, $R_{JFET}$, and $R_{EPX}$. These internal resistances consume power and generate undesirable heat inside the MOSFET. $R_{DSon}$ is preferably made as low as possible to minimize undesirable heat generation within the MOSFET and improve the energy efficiency of the device.

U.S. Pat. No. 4,593,302 to Lidow et al. describes a method for reducing pinch off resistance $R_{JFET}$ by ion implantation of a single doping agent (phosphorous) along the substrate surface 2a overlying the vertical drain portion 31 of the drain epitaxial region 32 prior to high temperature processing. During high temperature processing, the implanted doping agent diffuses down into the middle layer 32b of the epitaxial region 32 (N−) to increase the doping concentration of that region from N− to a predetermined higher level $N_I+$. This implanted doping concentration, $N_I+$, is intended to reduce pinch off resistance $R_{JFET}$ in the middle layer 32b by slowing depletion zone growth between and beneath the opposed knee segments 14d and 14d' of the shallow regions 14b, 14b' of the P-wells 14, 14'.

While it is possible to reduce on resistance $R_{DSon}$ by increasing the concentration $N_I+$ of the doping implant described by Lidow et al., an increase of the doping concentration $N_I+$ at the depth of the middle layer 32b can unfortunately also reduce the maximum blocking voltage $VDS_{max}$ of the MOSFET 1. When the MOSFET 1 is turned off, a portion of the depletion zone 35 near the knee segment 14d of the shallow region 14b begins to grow from a conduction state boundary line 35a (FIG. 1(b)) toward a pinch off boundary line 35b. At the pinch off boundary line 35b, the depletion zone 35 merges with an opposed depletion zone boundary line 35b' growing from the opposed knee segment 14d' of an opposing P-well 14' (FIG. 1(a)). This merger of the opposed depletion zone boundaries, commonly known as pinch off, creates a high resistance area that extends laterally across the vertical drain portion 31 and blocks relatively large voltages +HV, occurring within the bottom layer 32c of the drain epitaxial region from reaching weak portions of the PN junction near the substrate surface 2a. As a general rule, the upper vertical portions of the PN junction terminating at the substrate surface 2a are not able to withstand large voltages without breaking down when the MOSFET is turned off. However, if the shallow P-well regions 14b, 14b' are diffused to a sufficient depth $D_S$ (FIG. 1(a)), pinch off can be made to occur between opposed knee segments 14d, 14d' at a protective pinching depth b located beneath weak portions of the PN junction so as to protect the upper portions from exposure to large voltages. When choosing the dimensions of insulated gate devices such as the MOSFET 1, the p-well diffusion depth $D_s$ is often selected with this pinch off mechanism in mind. The design parameters required for such pinch off are well known in the field. These designs parameters are described for example, in the GE Handbook: *Design Manual for Prediction of the Avalanche Breakdown Voltage of Silicon Semiconductor Devices,* by Adler and Temple, incorporated herein by reference.

In addition to the creation of a merged depletion zone beneath weak upper layers of the vertical drain region during the OFF state of the MOSFET 1, the diffusion depth $D_S$ of the shallow regions 14b plays an important role in the ON state. An undesirable parasitic transistor (NPN), formed by the source region 12, well 14, and bottom layer 32c of the drain 30 can be activated when the MOSFET is in the ON state if the vertical distance $D_V$ (FIG. 1(a)) between the bottom of the source region 12 and the drain epitaxial region 32 is sufficiently narrow. Activation of this undesirable parasitic transistor is avoided among other ways, by diffusing the shallow regions 14b, 14b' to a preselected depth $D_S$ below the substrate surface 2a such that the vertical separation distance $D_V$ between the source and drain regions is sufficiently wide to prevent parasitic transistor turn on.

Referring still to FIG. 1(a), it will be appreciated by those skilled in the art that concomitant to any diffusion in the vertical direction to a preselected depth $D_S$, the doping agent used for forming the shallow region 14b diffuses laterally under the polysilicon gate 20 by a proportional lateral distance $D_L$ measured from the edge 20e of the gate layer. This lateral diffusion distance $D_L$ ultimately determines the width $L_{CH}$ of the channel region 14a and establishes therefrom, the channel resistance $R_{CH}$ of the MOSFET 1. A trade off is often necessary between diffusion to a desired shallow well depth $D_S$ and minimization of the channel resistance which contributes to the total on resistance $R_{DSon}$ of the device (FIG. 2(a)).

In the Lidow fabrication method (U.S. Pat. No. 4,593,302), the total on resistance $R_{DSon}$ of an MOSFET is minimized by increasing the implant doping concentration $N_I+$ so as to reduce the pinch off resistance $R_{JFET}$. But $N_I+$ cannot be increased without limit. Assuming that various factors such as the distance between opposed knee segments 14d, 14d' of the P-wells are predetermined, and the depth $D_s$ of the shallow region 14b is preselected to prevent parasitic transistor turn on, any adjustment of the implant doping concentration $N_I+$ is necessarily confined to levels below a maximum doping level $N_k$ at the pinching depth b if catastrophic avalanche breakdown is to be avoided. As noted earlier, the depletion zone 35 tends to be wider in lightly doped regions like the bottom layer 32c (N−) of the drain epitaxial region 32. There are fewer charge carriers in lightly doped regions so depletion occurs at a faster rate when a reverse bias voltage is applied across the PN junction. $N_k$ is a hypothetical doping level above which the depletion zone 35 (FIG. 1(b)) grows too slowly and therefore fails to reach the pinch off boundary line 35b before a critical electric field develops in weak regions above the protective pinching depth b, allowing the device to go into avalanche breakdown.

The relationship between the implant doping concentration $N_I+$ at the protective pinching depth b and premature breakdown at voltages below a desired maximum blocking voltage $V_{DSmax}$ is perhaps better explained by reference to a schematic diagram. FIG. 2 (b) is a simplified schematic diagram of the MOSFET 1 in its high voltage blocking mode. More heavily doped portions of the semiconductor material surrounding the reverse biased PN junction are not capable of withstanding the same reverse voltages which can be safely applied to the lighter doped regions (N−) because the depletion zone 35 does not expand as rapidly in the areas where charge carrier concentration is higher. Since the doping concentration $N_I+$ in the vertical drain portion 31 is the most heavily doped region adjacent to the PN junction of FIG. 2(b), the implant concentration just below the protective pincing depth b is in effect the weakest part of that PN junction. Consequently, any increase of the implant doping concentration $N_I+$ at the substrate surface increases the doping concentration just below the protective pinching depth b and weakens the PN junction's ability to withstand large reverse voltages $V_{DSmax}$ in the current blocking mode. Design flexibility for selecting the implant doping concentration $N_I+$ is therefore limited to a choice between reducing $R_{DSon}$ by increasing $N_I+$ or maximizing $V_{DSmax}$ by decreasing $N_I+$ for devices fabricated according to U.S. Pat. No. 4,593,302.

SUMMARY OF THE INVENTION

It is an object of the present invention to provide a method for adjusting the total on resistance $R_{DSon}$ of an insulated gate device independently of the maximum blocking voltage $V_{DSmax}$ of the device. In accordance with the present invention, during fabrication of an insulated gate device, a slow-diffusing drain-forming dopant is implanted along a substrate surface overlapping the boundary between a to-be-formed vertical drain region and an adjacent to-be-formed channel well. The diffusion coefficient of the slow-diffusing dopant is relatively low compared to the diffusion coefficient of a channel-forming dopant that is subsequently introduced to create an adjacent channel-forming well of a preselected depth $D_S$. During heat processing, the slow-diffusing drain-forming dopant will remain generally in an upper portion $D_A$ of the preselected depth while the relatively faster channel-forming dopant diffuses downwardly to the full extent of the preselected depth $D_S$. Lateral interaction between the slow-diffusing drain-forming dopant and the faster channel-forming dopant in the upper portion of the preselected depth, determines how far the channel-drain boundary forms away from a subsequently introduced source region.

A high concentration of the slow-diffusing drain-forming dopant can be used to substantially neutralize or retard undesirable lateral expansion of the channel-drain boundary away from the source region and thereby produce devices of relatively reduced channel width. Since the slow-diffusing drain-forming dopant remains substantially concentrated within an upper portion $D_A$ of the preselected depth it does not affect doping concentration at lower depths and in particular at a protective pinching depth b, where doping concentration can affect the maximum blocking voltage of the insulated gate device. Doping concentration in the upper portion $D_A$ of a vertical drain region formed according to the present invention can therefore be raised to a significantly high level to thereby retard lateral widening of a to-be-formed channel region and this doping level is generally not restricted by high voltage blocking considerations which limit design flexibility at lower depths.

A thus formed vertical drain region can be designed to be lightly doped at deeper portions of the preselected depth such that an adjacently introduced channel-forming dopant will "cut" laterally into the deeper portions of the vertical drain region to form a "neck" in the vertical drain region where protective pinch off generally occurs. In a preferred embodiment, a fast-diffusing drain-forming dopant is implanted along with the slow-diffusing drain-forming dopant to reduce pinch off resistance in deeper portions of the vertical drain region. The doping concentration of the fast-diffusing drain-forming agent may be adjusted independently of the doping concentration of the slow-diffusing dopant.

BRIEF DESCRIPTION OF THE DRAWINGS

FIG. 5 is a cross-sectional view for explaining lateral interaction between the slow-diffusing drain-forming dopant of the present invention and a fast-diffusing channel-forming dopant introduced through a surface mask opening.

FIG. 6 is a graph showing the concentration of competing channel-forming and drain-forming doping agents in the lateral direction near the top surface of the substrate shown in FIG. 5.

FIG. 10 is a cross-sectional view of an in-process wafer after an initial masking step.

FIG. 11 is a cross-sectional view of an in-process wafer after diffusion of a deep portion of a channel-forming well.

DETAILED DESCRIPTION

The present invention provides a fabrication method that allows independent adjustment of the total on resistance $R_{DSon}$ and maximum blocking voltage $V_{DSmax}$ of an insulated gate device in which the two operating characteristics may be set individually to suit the requirements of a specific environment for which the device is intended.

During fabrication of an insulated gate device formed in accordance with the present invention, preferably before formation of a polysilicon gate layer above the top surface of a silicon substrate; predetermined amounts of a slow-diffusing doping agent A (such as arsenic, antimony, and bismuth for forming n-type semiconductor regions, or indium and thallium for forming p-type semiconductor regions) and a comparatively fast-diffusing doping agent B (such as phosphorous or boron) are introduced at the top surface of a lightly doped epitaxial region of the substrate, overlapping an area where a generally vertical channeldrain boundary is to be formed. After high temperature processing, a multiple concentration doping profile will develop in the vertical direction below the substrate surface as will be explained in more detail below by referring to FIG. 3, with the slow-diffusing doping agent A penetrating into the epitaxial layer by a small distance $D_A$ and the faster diffusing agent B diffusing to a greater depth $D_B$.

Figure 3:
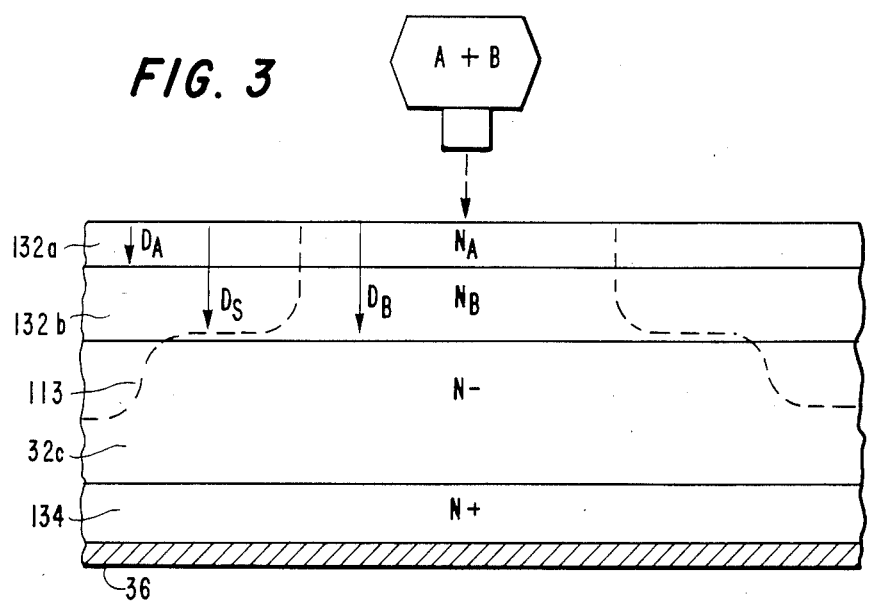
FIG. 3 is a cross-sectional view illustrating formation of a multiple layer doping profile according to the present invention.

FIG. 3 is a cross-sectional view of an in-process silicon wafer treated according to the above method such that a first doping layer 132a having a first doping concentration $N_A$ and penetration depth $D_A$ forms above a second doping layer 132b which has second doping concentration $N_B$. The first and second doping layers 132a and 132b are disposed above a lighter doped epitaxial layer 132c (N—) which is coupled to a substrate metal layer 36 by way of a substrate bulk layer 134 (N+). The dashed lines 113 of FIG. 3 indicate the general outline of a to-be-formed well 114 which includes a shallow region 114b that has a preselected diffusion depth $D_S$ less than or approximately equal to $D_B$. The shallow region 114b is preferably formed by a doping agent which diffuses at roughly the same rate as the fast-diffusing agent B.

Figure 4:
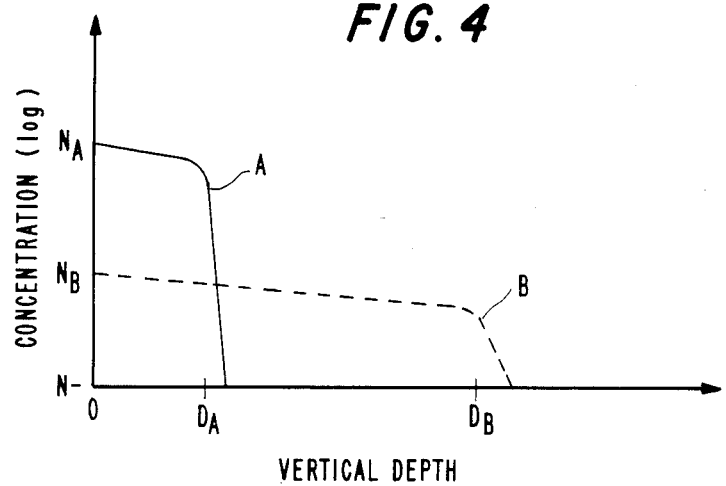
FIG. 4 is a graph showing the resultant doping concentration in the vertical drain region of an insulated gate device fabricated according to the present invention.

FIG. 4 is a doping concentration profile showing the concentration of the slow-diffusing agent A and the fast-diffusing agent B moving from the top surface 2a of the substrate (depth=0) toward the deeper bulk regions. The concentration NA of the slow-diffusing agent A is preferably selected to be much larger than the concentration $N_B$ of the fast-diffusing agent B. Selection of a substantially larger concentration NA for the upper layer 132a is independent of any desired setting for the doping concentration NB and diffusion depth DB for the second layer 132b since the slow diffusing agent A remains substantially confined in the upper layer 132a and does not influence the lower layer 132b.

Figure 7:
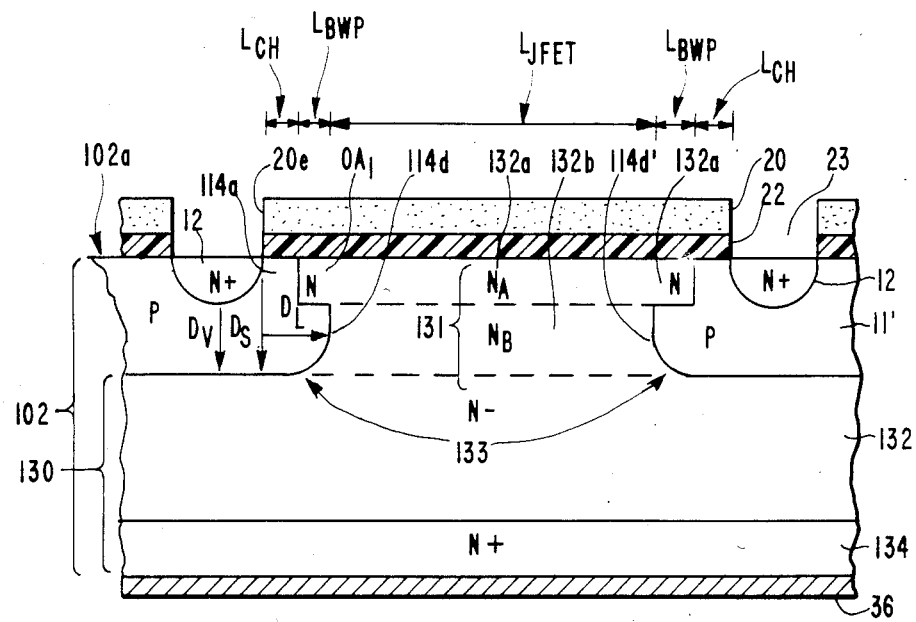
FIG. 7 is an exaggerated cross-sectional view for explaining channel shortening according to the present invention.

Following the implantation of the slow and fast-diffusing agents, A and B, a masking layer formed of a silicon dioxide layer 22 and a polysilicon layer 20 is grown over the top surface of the substrate and etched to form openings 23 to the substrate surface 2a as shown in FIG. 5. A channel forming doping agent $P_{CH}$ having a diffusion coefficient that is higher than that of the slow diffusing agent A, is introduced to the top surface of the substrate through the openings 23 in the masking layer. During subsequent high temperature processing, the channel-forming doping agent $P_{CH}$ diffuses both laterally and vertically into the substrate as indicated by dashed profile lines $P_0$, $P_{-1}$, $P_{-2}$, and $P_{-3}$ to form regions of progressively decreasing doping concentration moving away from the point of introduction at the substrate surface 2a. Of importance, the channel-forming concentration $P_0$, at the mask opening 23, is selected to be higher than $N_A$ in order to ensure that a p-type channel region 14a forms at the substrate surface (FIG. 7).

The channel-forming agent $P_{CH}$ diffuses laterally under the masking layer to interact with the slow-diffusing agent A in the upper layer 132a. The interaction creates two overlap areas $OA_1$ and $OA_2$ that are separated by a neutral profile line $P_{-2}$ in FIG. 5. In the illustrated embodiment, the doping effects of the $P_{CH}$ and A doping agents cancel each other equally at the $P_{-2}$ profile line. Moving from the neutral profile line $P_{-2}$ toward the adjacent opening 23 in the masking layer, the concentration of the $P_{CH}$ doping agent dominates and causes the second overlap area $OA_2$ to develop as a p-type semiconductor region. Conversely, the concentration $N_A$ of the A doping agent on the other side of the neutral profile line $P_{-2}$ cancels the effects of the channel-forming dopant $P_{CH}$ and causes the first overlap area $OA_1$ to act as a n-type semiconductor region. The cross over points from p-type semiconducting material to n-type semiconducting material at each lateral plane of the substrate 2 will define the shape of the channel-drain boundary wall between the to-be-formed channel and drain regions of the MOSFET.

FIG. 6 is a graph which illustrates how the doping concentrations of the counteracting p-type and n-type doping agents are distributed in the lateral direction near the top surface of the substrate. The n-type drain-forming dopants, A and B, are implanted uniformly along the substrate surface by well known means such as ion implantation prior to formation of the masking layer (20 and 22) so that their respective doping concentrations, $N_A$ and $N_B$, are substantially constant in the lateral direction. In contrast, the channel forming agent $P_{CH}$ is introduced after formation of the masking layer so that its doping concentration develops a lateral gradient that has its highest concentration level $P_0$ near the opening in the mask and progressively lower concentration levels, $P_{-1}$, $P_{-2}$ and $P_{-3}$, respectively forming further away from the mask opening. The location of the channel-drain boundary line $P_{-2}$ is established by selection of the doping concentration $N_A$ of the slow-diffusing agent A, the concentration $P_0$ of the channel forming agent $P_{CH}$ at the opening in the masking layer, and the slope of the $P_{CH}$ gradient laterally away from the masking layer opening (by appropriate control of the drive-in temperature and other factors), at the time of fabrication.

In summary, according to the present invention, the location of the channel-drain boundary between the channel region and the top layer of the drain epitaxial region is determined by implanting a preselected amount of a slow-diffusing agent A prior to high temperature drive-in of such concentration that its resultant doping concentration $N_A$ neutralizes a laterally diffusing portion of the channel-forming doping agent $P_{CH}$. This retards channel widening along the lateral direction just below the substrate surface to produce a channel width reducing effect.

FIG. 7 is an exaggerated cross sectional view of the resulting wafer profile after a source region 12 (N+) is introduced through the openings 23 in the masking layer. Since the concentration $N_A$ in the upper layer 132a of the drain epitaxial region 132 is much greater than the concentration $N_B$ in the middle layer 132b, the channel-drain boundary wall will "project" at the top surface of the substrate laterally and inwardly towards the source region 12. The projection distance $L_{BWP}$ of the boundary wall projection, measured from the knee segments 114d, 114d' of the shallow well, determines the reduction in lateral length $L_{CH}$ of the adjacent channel region 114a. Conversely, since the doping concentration $N_B$ in the lower layer 132b is less than $N_A$, the channel-forming well 114 "cuts" laterally into the lower layer 132b of the vertical drain region 31 by a lateral diffusion distance $D_L$ measured from the edge 20e of the polysilicon layer 20 to form a "neck" 133 in the vertical drain region 131.

Figure 1A:
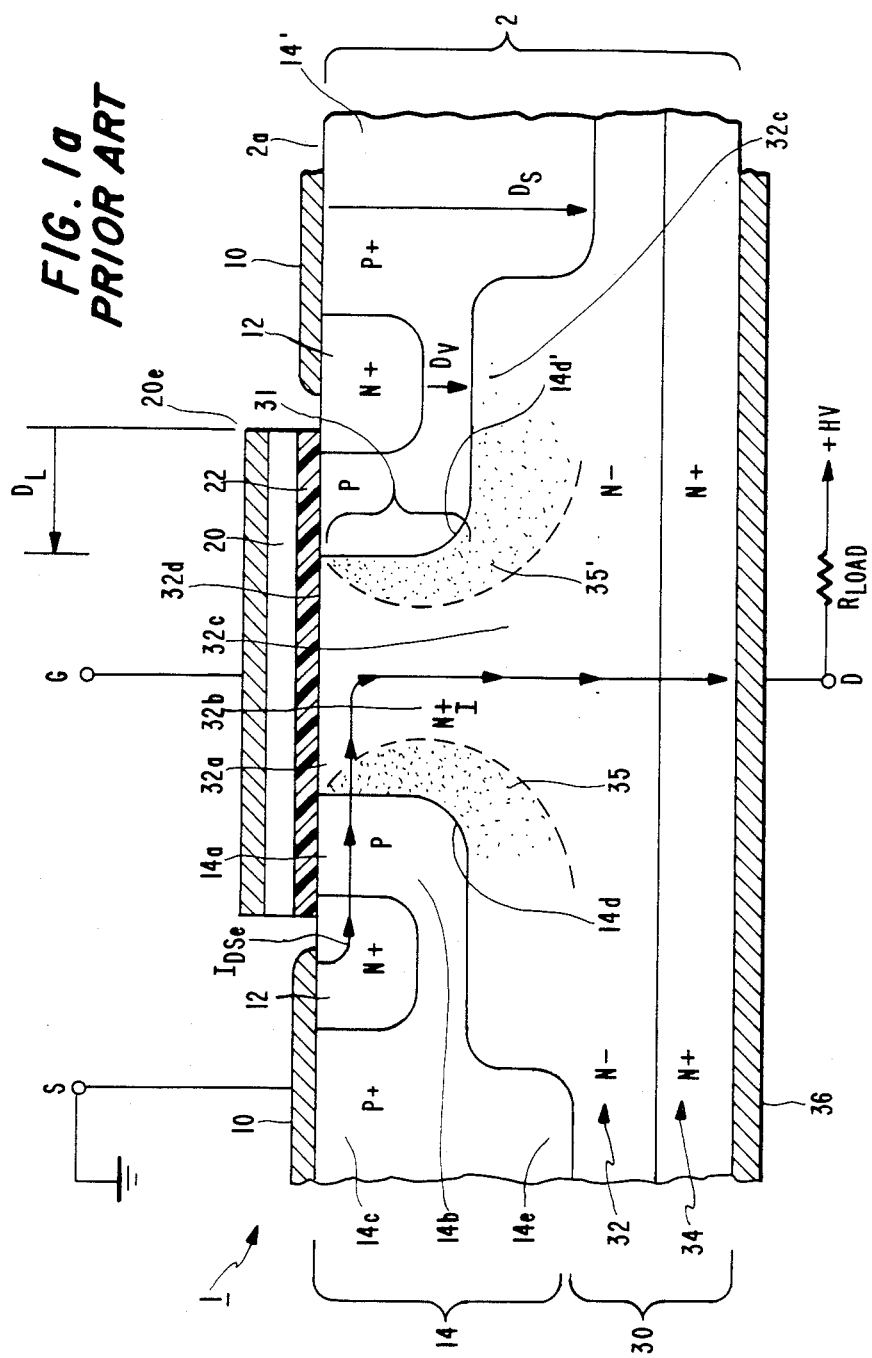
FIG. 1(a) is a cross-sectional view of a known power MOSFET.
Figure 1B:
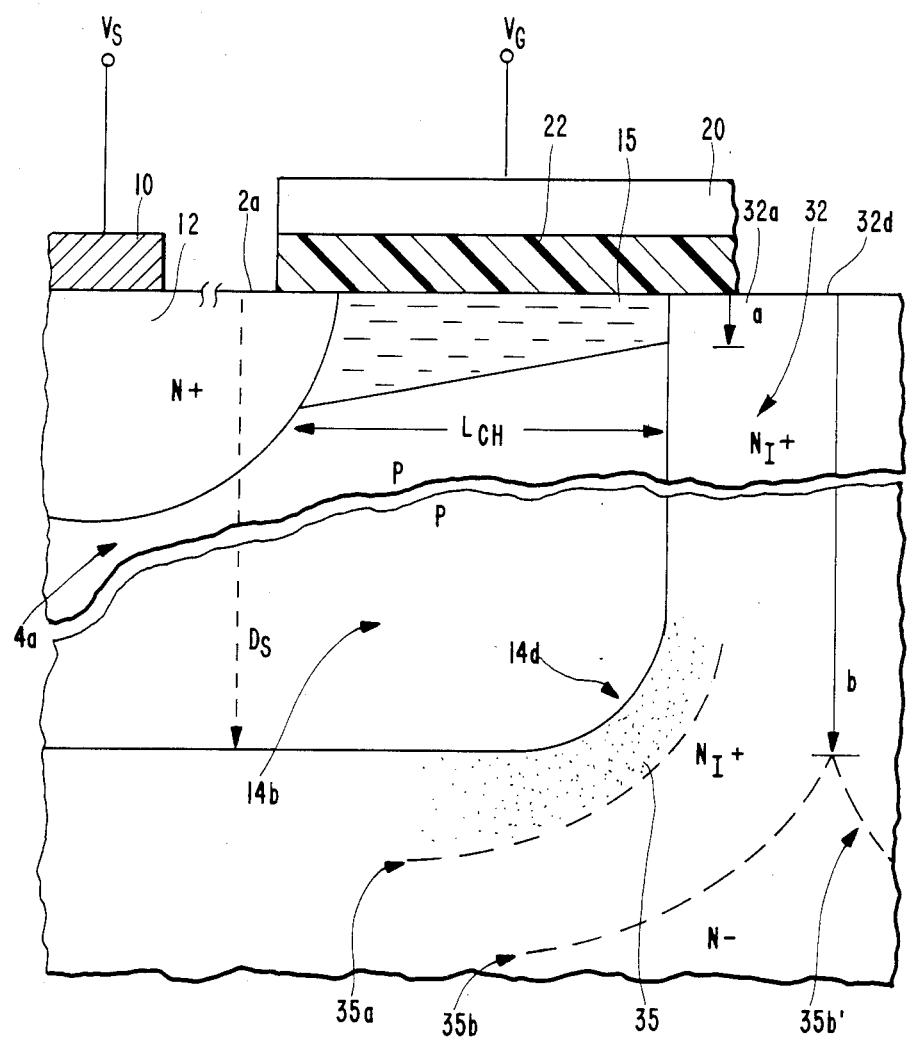
FIG. 1(b) is an enlarged view of a shallow portion of the channel-forming well shown in FIG. 1(a).
Figure 1C:
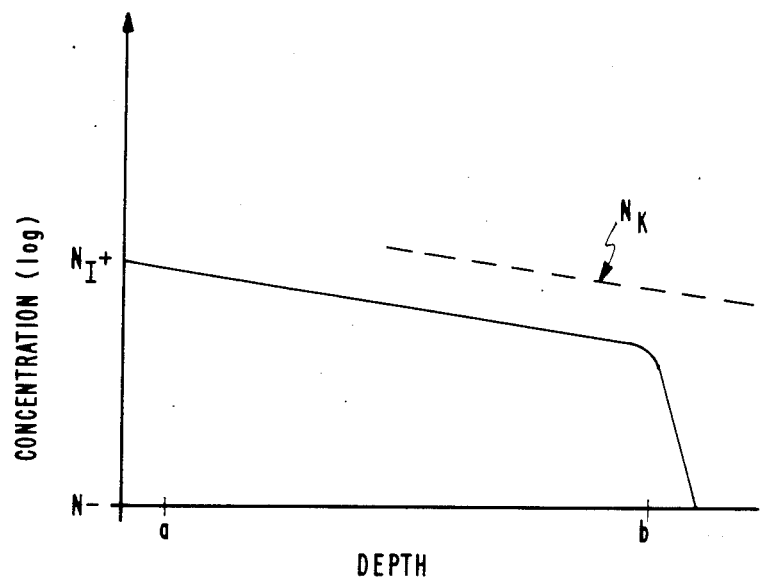
FIG. 1(c) is a graph showing the concentration of a pinch off resistance implant versus vertical depth for the MOSFET of FIG. 1(a).
Figure 2A:
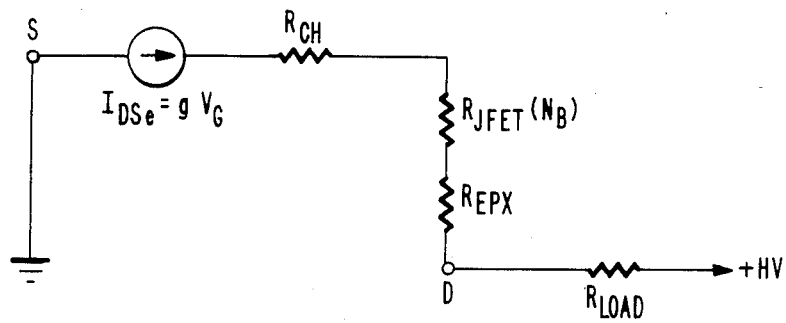
FIG. 2(a) is an equivalent circuit of a MOSFET during a current conduction state.
Figure 2B:
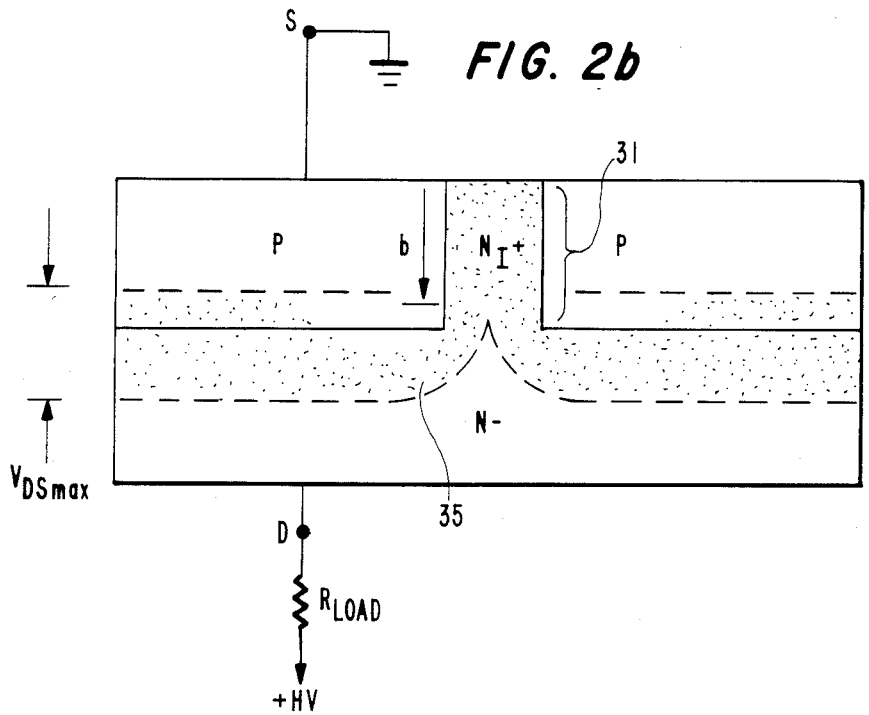
FIG. 2(b) is a schematic structural diagram of a MOSFET during a nonconductive high voltage blocking mode.
Figure 8:
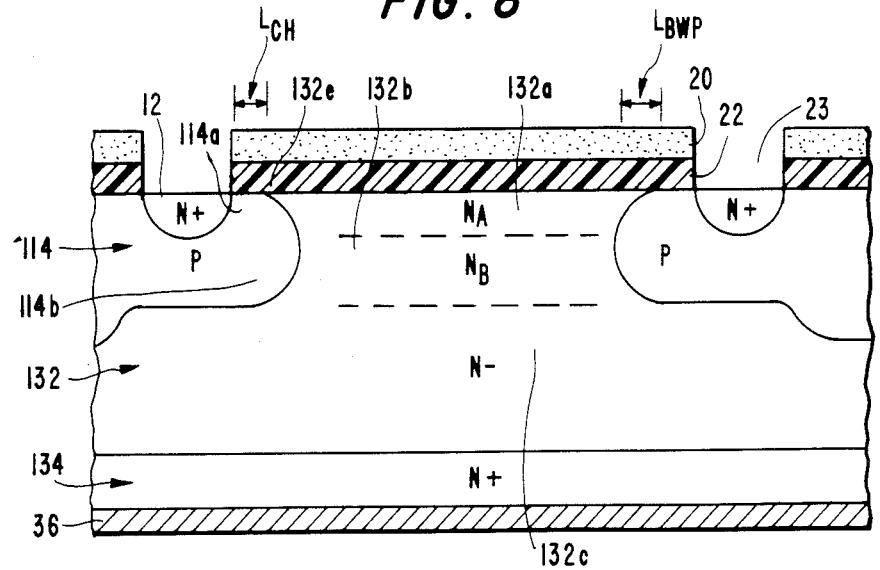
FIG. 8 is a cross-sectional view of a "bent" channel-drain boundary line in accordance with the present invention.

FIG. 8 provides a more realistic picture of the boundary wall as it is believed to form between drain epitaxial regions 132a, 132b and the p-well 114. The interaction between the oblique concentration gradient of the p-well forming dopants and the vertical concentration gradient of the drain epitaxial region dopants is believed to result in a "bending in" of the top portion 132a of the boundary wall by a distance, $L_{BWP}$, away from the vertical, inwardly toward the source region 12 which results in shortening of the channel width $L_{CH}$. This shortening reduces channel resistance $R_{CH}$ during the ON state of the MOSFET and thereby lowers the total on resistance $R_{DSon}$ of the device without affecting the maximum blocking voltage $V_{DSmax}$ adversely. It also reduces the threshold voltage of the MOSFET so the device will respond to a smaller applied gate voltage $V_G$. Device gain, as measured by transconductance g (FIG. 2(a)) also increases.

The concept of shortening the channel width $L_{CH}$ is of course predicated on a normalized view of surrounding features. In this context, attention is drawn to the depth $D_S$ of the shallow region 114b of the well 114 of FIG. 7. The vertical separation $D_V$ between the source region 12 and the drain region 130 determines the width of the base of a parasitic transistor crossing from the bottom of the source region 12 to the lateral portion of the drain epitaxial region 132 directly beneath the shallow region 114b. As previously discussed, undesirable turn on of this parasitic transistor may be prevented, among other ways, by increasing the vertical separation distance $D_V$ in order to widen the base of the parasitic transistor and thereby reduce its gain. The channel forming dopant $P_{CH}$ is preferably diffused downwardly below the substrate surface to a relatively large preselected depth $D_S$ in order to prevent parasitic transistor turn on. Concomittant with any desired diffusion of the channel-forming dopant $P_{CH}$ in the vertical direction to the selected $D_S$ depth, a lateral diffusion of the same dopant effectively "cuts" laterally into the drain region of the device during fabrication by a lateral distance $D_L$. At the deeper pinching level b, lateral cutting by the channel forming dopant $P_{CH}$ forms the neck 133 of the JFET constriction area $L_{JFET}$. At the same time, lateral interaction between the channel forming dopant $P_{CH}$ and the doping concentration in the upper layer 132a of drain epitaxial region 132 determines the effective channel width $L_{CH}$ of the channel region 114a just below the substrate surface (at least to the depth of the inversion layer). Since all dimensions are relative, the so called "channel shortening" feature is measured by reference to a preselected depth $D_S$ for the shallow region 114b and a preestablished pinch off spacing or constriction width, $L_{JFET}$ that may be selected for the pinch off neck 133 for the vertical portion 131 of the drain epitaxial region 132. By shortening the channel width according to the present invention, designers can improve various device parameters including, packing density (distance between adjacent vertical drain portions of multiple cell devices), the total on resistance $R_{DSon}$ of such a device, the device transconductance g, the maximum blocking voltage $V_{DSmax}$ during the OFF state (by reducing $N_B$), and the threshold voltage of the ON state, to thereby produce insulated gate devices with enhanced operating characteristics.

In typical applications, the shallow region 114b of the channel-forming well is diffused to a depth in the range of 1-8 microns, and preferably between 2.5-6.0 microns. The fast-diffusing drain-forming dopant B is generally driven to a depth $D_B$ that is slightly deeper or approximately equal to the preselected depth $D_S$ of the shallow region 14b. The slow-diffusing agent A is preferably kept as close to the substrate surface as possible, the selected $D_A$ depth should of course not be less than that of the inversion layer depth a if reduction in $R_{DSon}$ is desired. It may be economically preferable to implant both the slow and fast drain-forming dopants, A and B, at the same time in a single fabrication step. Under such conditions, the slow diffusing agent A will generally be confined to an upper layer depth $D_A$ between 0.1-2.0 microns and preferably to a depth of less than 1.0 micron. When arsenic (slow) and phosphorous (fast) are implanted simultaneously for example, the diffusion depth $D_A$ of the slow-diffusing agent (arsenic) can be kept at less than 1.0 micron even when the fast diffusing agent (phosphorous) is to be driven to a depth of 8 microns because the diffusion coefficient ratio between the two species is roughly 10:1 in silicon.

The doping concentration $P_0$ at the top surface 2a of the substrate near the mask opening 23 is typically $5 \times 10^{16}$ atom/cm$^2$. Doping concentrations in the adjacent vertical portion of the drain epitaxial region 32 are adjusted such that:

$$P_0 > N_A > N_k > N_B \geq N-;$$

where $N_A$ is the doping concentration of the slow-diffusing agent A, $N_B$ is the concentration of the fast-diffusing agent B, $N-$ is the concentration of the drain epitaxial region 132 before wafer processing, and $N_k$ is a hypothetical avalanche breakdown level above which, avalanche breakdown will begin to occur at the $D_B$ depth for a predetermined maximum blocking voltage $V_{DSmax}$. As noted earlier, $N_B$ is preferably chosen to be much less than $N_A$. Since $N_A$ and $N_B$ are independently adjustable, there is a significant increase in design flexibility.

Figure 9:
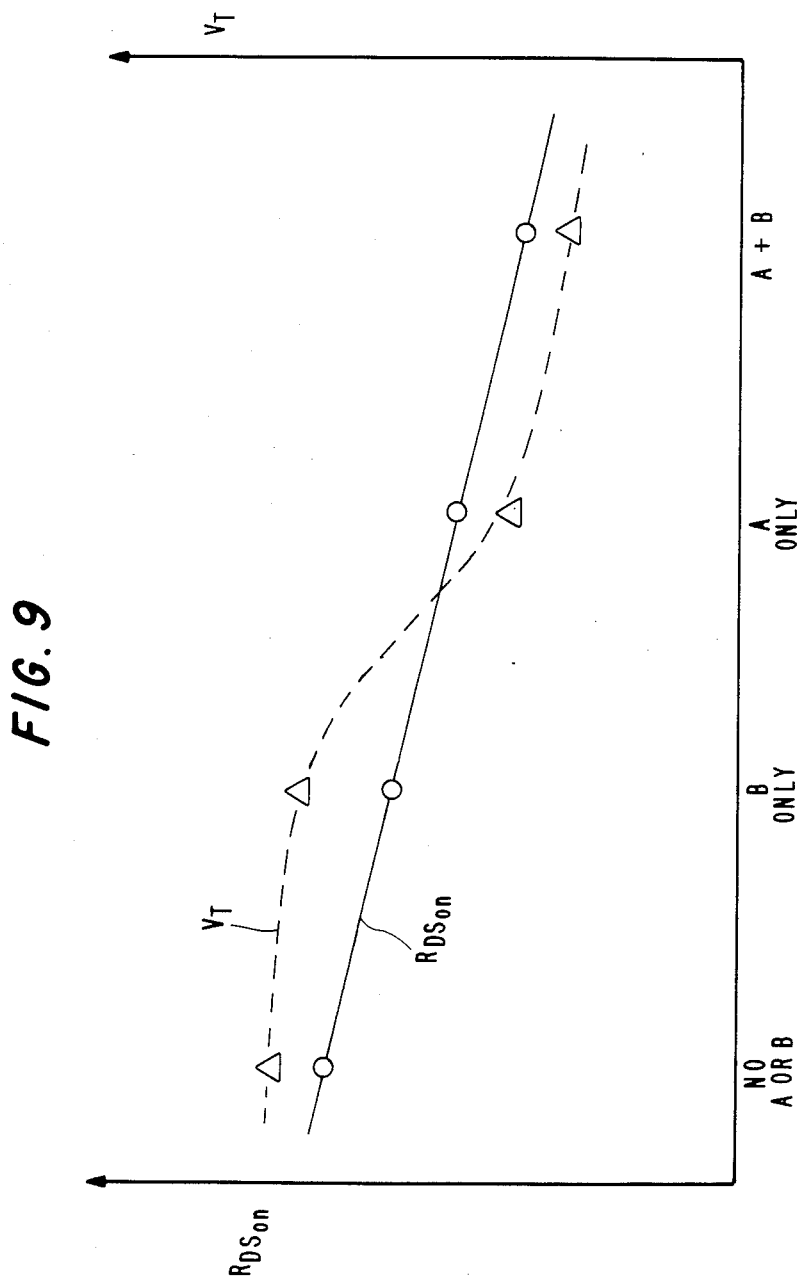
FIG. 9 is a graph of experimental results for comparing the on resistance and threshold voltage of insulated gate devices fabricated according to the present invention relative to those of devices fabricated in accordance with previously known techniques.

FIG. 9 shows the results of measurements made for the on resistance $R_{DSon}$ and threshold voltage $V_T$ of four devices that were fabricated to generally equal dimensions but formed with: no A or B implant, only a fast-diffusing B implant, only a slow-diffusing A implant, and a combined fast and slow diffusing A+B implant. Equal amounts of arsenic and phosphorous were implanted at the surface of the devices for the respective A and B implants. As expected, the B only implant reduced pinch off resistance $R_{JFET}$, resulting in a decreased $R_{DSon}$. Surface implantation of only the slow-diffusing agent A resulted in an even lower $R_{DSon}$. When both A and B were combined, a still further reduction in $R_{DSon}$ was observed. Similar results were obtained for measurement of the threshold voltage $V_T$ of each device. These results confirm that channel shortening is occurring with implantation of the slow diffusing agent A.

The reduction in $R_{DSon}$ due to surface implantation of the slow-diffusing agent A appears to be independent of the pinch off reducing effects of the faster diffusing agent B. Moreover, significant improvement in device transconductance g was noted (as evidenced by the drop in the threshold voltage $V_T$) when the slow-diffusing agent A was implanted.

Since it is possible to reduce $R_{DSon}$ in accordance with the present invention by shortening the channel length $L_{CH}$, a lighter doping concentration $N_B$ can be used in the pinch off region to increase the maximum blocking voltage $V_{DSmax}$ of a device while retaining the improved $R_{DSon}$ performance of previous devices. In addition, the channel shortening effect obtained according to the present invention results in improved device transconductance g (see FIG. 2(a)) and permits increased packing density (e.g., shorter distance between adjacently formed vertical drain portions).

Figure 12:
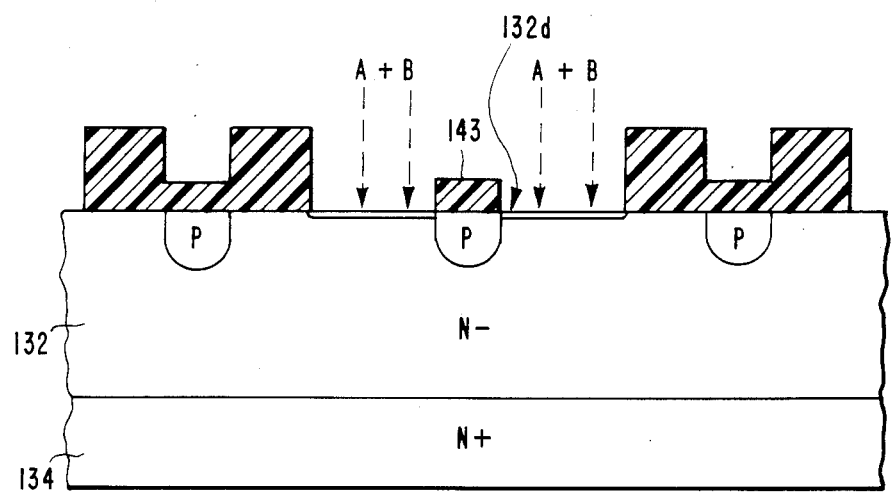
FIG. 12 is a cross-sectional view showing implantation of fast and slow diffusing dopants in accordance with the present invention.
Figure 13:
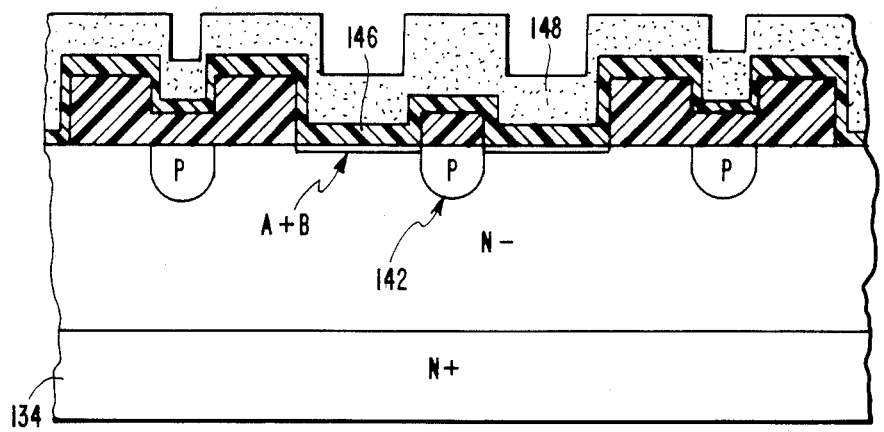
FIG. 13 is a cross-sectional view of an in-process wafer after growth of a gate-forming layer and a gate-insulating layer.
Figure 14:
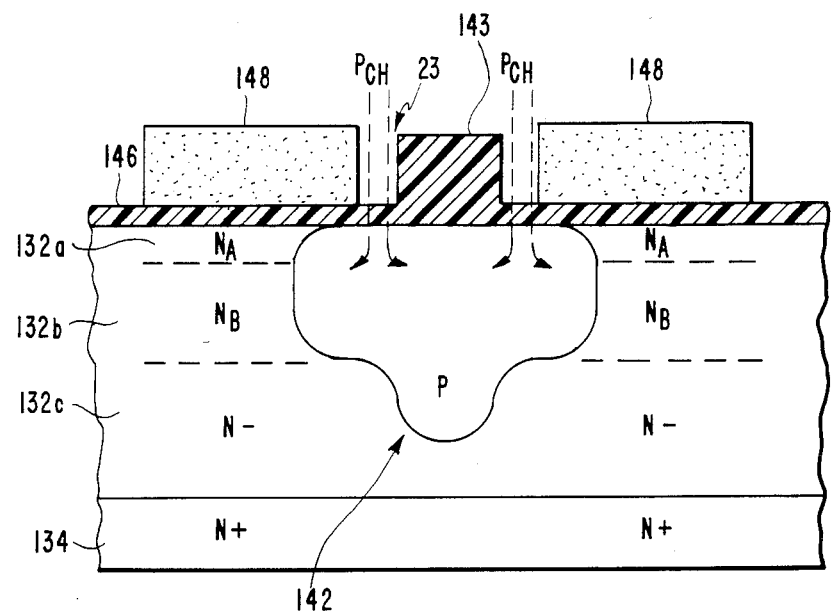
FIG. 14 is a cross-sectional view of an in-process wafer following high temperature drive-in of a shallow channel-forming dopant and the fast and slow drain-forming dopants.
Figure 15:
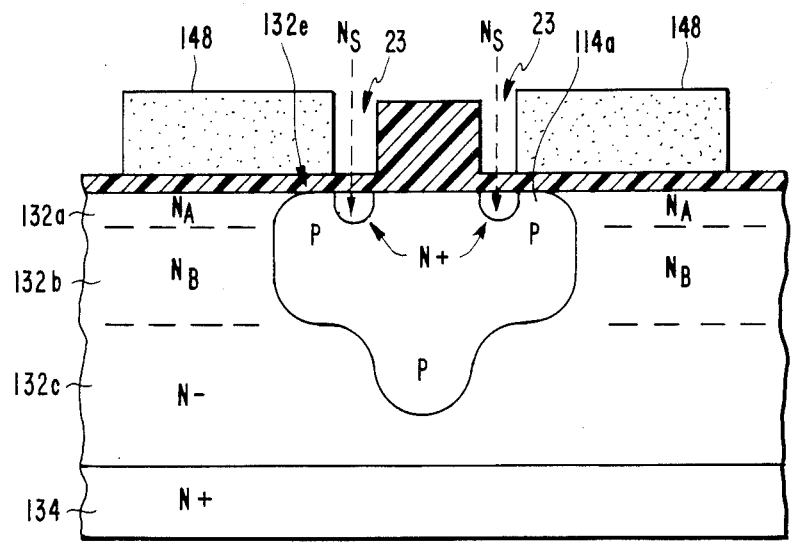
FIG. 15 is a cross-sectional view of an in-process wafer after a source-well diffusion step.

FIGS. 10-15 illustrate a preferred fabrication process for manufacturing a MOSFET device according to the present invention. In FIG. 10, an initial masking layer comprising thick silicon dioxide stubs 150 and thin silicon nitride layers 138 are deposited on the top of a thin pad oxide layer 138' which is on top of surface 132d of a wafer epitaxial layer 132 (N−). Deep p-wells 140, 142 and 144 are diffused through the openings in the masking layer and capped by silicon dioxide stubs 141, 143 and 145 as shown in FIG. 11. The silicon nitride layers 138 are etched away to open windows for uniform ion implantation of the slow and fast diffusing doping agents, A and B, as indicated in FIG. 12. FIG. 13 illustrates a gate oxide layer 146 grown over the exposed ion implant region surrounding p-well 142 and a polysilicon layer 148 is deposited on the gate oxide layer 146. Portions of the polysilicon layer 148 are removed to create a mask with openings 23 for subsequent ion implantation of a shallow well-forming agent $P_{CH}$, such as boron. This is followed by a high temperature drive-in step in which the initially formed p-well 142 diffuses deeper into the bulk of the wafer, the shallow well-forming dopant $P_{CH}$ diffuses both vertically and laterally from the openings in the polysilicon mask, and the previously deposited slow and fast diffusing agents, A and B, expand into the wafer bulk to form the upper layer concentration $N_A$ and the lower layer concentration $N_B$ as shown in FIG. 14. As described earlier, the upper portion 132a of the epitaxial drain region "bends" back toward the openings 23 in the polysilicon mask 148 as a result of counteracting doping effects just below the substrate surface between the graded concentration of the shallow well-forming agent $P_{CH}$ and the laterally uniform distribution $N_A$ in the upper layer, of the slow-diffusing drain-forming dopant A. The distance between the edge 132e of the drain region "bend" and the edge of the polysilicon mask opening will develop as the channel region 114a of the MOSFET. FIG. 15 shows the resultant wafer following introduction of the source doping agent $N_S$ through the openings 23 in the masking layer. The active channel region 114a forms near the top surface of the substrate between the edge 132e of the "bend" in the drain epitaxial region and the top edge of the diffused N+ source wells.

Persons skilled in the art of device fabrication will appreciate that the method disclosed by FIGS. 10-15 is but one of many possible variations for manufacturing an insulated gate device according to the present invention. Among its various features, the invention increases design flexibility by allowing independent selection of the $N_A$ and $N_B$ doping concentrations, and by providing greater latitude in the selection of $D_S$ and $L_{CH}$ dimensions. Given the increased latitude in design options possible with the disclosed method, a large variety of devices with improved operating characteristics can be fabricated in accordance with the present invention. The present invention is to be defined not only by the illustrated embodiments but more so by the spirit of the foregoing discussion and the scope of the claims appended hereto including equivalent modifications thereof.

We claim:

1. An insulated gate device, comprising:
   a substrate having a major top surface;
   a drain region having a vertical portion that extends to the top surface;
   first and second channel-forming well portions projecting into the substrate from the top surface to a first predetermined depth, the first and second channel-forming well portions being contiguous with the drain region and being laterally spaced by the vertical portion of the drain region;
   the drain region including at least three layers: (a) an upper layer of the vertical portion, that includes a relatively slow-diffusing dopant and extends to a second predetermined depth, the second predetermined depth being shallower than said first predetermined depth; (b) a lower layer of the vertical portion, that includes a relatively fast diffusing dopant and extends from said second predetermined depth to said first predetermined depth; and (c) a background layer, extending beneath said first predetermined depth;
   the upper layer of the vertical portion being more heavily doped than the lower layer of the vertical portion and the lower layer of the vertical portion being more heavily doped than the background layer, such that the spacing between the first and second channel-forming well portions is greater between the top substrate surface and the second predetermined depth than it is between the second predetermined depth and the first predetermined depth.

2. An insulated gate device according to claim 1 wherein the first predetermined depth is in the range 1-8 microns and the second predetermined depth is in the range 0.1-2.0 microns.

3. An insulated gate device according to claim 1 wherein the fast-diffusing dopant is phosphorous and the slow-diffusing dopant is arsenic.

4. An insulated gate device according to claim 1 wherein the fast-diffusing dopant is boron and the slow-diffusing dopant is indium.

5. An insulated gate device according to claim 1 wherein the slow-diffusing dopant is selected from the group consisting of antimony, arsenic, bismuth, indium and thallium.

6. An insulated gate device according to claim 1 wherein the slow-diffusing dopant concentration is generally uniform in the lateral direction and doping concentration in the surrounding channel region decreases laterally toward the drain region.

* * * * *